(12) United States Patent
Choi

(10) Patent No.: US 7,382,010 B2
(45) Date of Patent: Jun. 3, 2008

(54) ACTIVE PIXEL SENSOR HAVING HONEYCOMB STRUCTURE

(75) Inventor: Sung-Ho Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 223 days.

(21) Appl. No.: 11/193,917

(22) Filed: Jul. 29, 2005

(65) Prior Publication Data

US 2006/0118837 A1    Jun. 8, 2006

(30) Foreign Application Priority Data

Dec. 7, 2004    (KR) .................. 10-2004-0102363

(51) Int. Cl.
 *H01L 31/062* (2006.01)
(52) U.S. Cl. .................. 257/292; 257/294
(58) Field of Classification Search .......... 257/231, 257/233, 239, 292, 294
 See application file for complete search history.

(56) References Cited

U.S. PATENT DOCUMENTS 6,107,655 A * 8/2000 Guidash ............... 257/233
6,750,912 B1   6/2004 Tennant et al. ........ 348/300

OTHER PUBLICATIONS

Japanese Patent Application No. 08-195908 to Dickinson et al, having Publication date of Jul. 30, 1996 (w/ English Abstract page).
Japanese Patent Application No. 2004-153253 to Sekine, having Publication date of May 27, 2004 (w/ English Abstract page).
Korean Patent Application No. P1999-0084630 to Kim et al, having Publication date of Dec. 6, 1999 (w/ English Abstract page).
Japanese Patent Application No. 2001-077344 to Nobuo, having Publication date of Mar. 23, 2001 (w/ English Abstract page).

* cited by examiner

*Primary Examiner*—Mark V. Prenty
(74) *Attorney, Agent, or Firm*—Monica H. Choi

(57) ABSTRACT

An active pixel sensor of the present invention includes photo diodes with at least five side such as six sides arranged in a honeycomb structure with sharing of a floating diffusion (FD) region for increased fill factor. In addition, with sharing of transistor devices by multiple photo diodes, the fill factor is advantageously maximized.

19 Claims, 11 Drawing Sheets

AREA OF HEXAGON: $(3^{0.5}*3/2)*R^2$

PIXEL PITCH: $(3^{0.5}/2)*R$

AREA OF SQUARE: X^2

PIXEL PITCH: X

US 7,382,010 B2

ACTIVE PIXEL SENSOR HAVING HONEYCOMB STRUCTURE

BACKGROUND OF THE INVENTION

This application claims priority to Korean Patent Application No. 2004-102363, filed on Dec. 7, 2004, in the Korean Intellectual Property Office, the disclosure of which is incorporated herein in its entirety by reference.

1. Field of the Invention

The present invention relates generally to optical image sensors, and more particularly, to an active pixel sensor with photo diodes arranged in a honeycomb structure.

2. Description of the Related Art

Imaging systems implemented with complementary metal-oxide semiconductor (CMOS) technology have reduced cost and power compared to conventional charge-coupled device (CCD) imagers. To generate video or still images, various techniques replacing CCD sensors have been developed. Such various techniques are largely divided into passive pixel sensors and active pixel sensors according to whether signal amplification is performed in each pixel or in a support circuit. Passive pixel sensors have advantages of a simple pixel and a high optical fill factor. Active pixel sensors include an amplifier in each pixel to enhance signal transmission and signal sensitivity and thus have a low optical fill factor.

FIG. 1 illustrates a conventional active pixel sensor. A pixel 100 includes a photo diode 101, a transmission transistor 102, a floating diffusion (FD) region, a reset transistor 103, an amplifying transistor 104, and a row selection transistor 105. Since these many elements are included in the pixel 100, a fill factor is low.

Therefore, a pixel architecture with increased fill factor is desired for an active pixel sensor.

SUMMARY OF THE INVENTION

Accordingly, an active pixel sensor of the present invention includes photo diodes with at least five side such as six sides arranged in a honeycomb structure with sharing of a floating diffusion (FD) region for increased fill factor.

In a general aspect of the present invention, a pixel unit includes a plurality of photo diodes with each photo diode fabricated with at least five sides. In addition, the pixel unit includes a floating diffusion region disposed between the photo diodes. Furthermore, the pixel unit includes a plurality of transmission devices with each transmission device disposed and coupled between a respective photo diode and the floating diffusion region.

In another aspect of the present invention, the pixel unit includes a reset device coupled to the floating diffusion region, and includes a selection device and an amplifying device coupled in series to the floating diffusion region.

In one embodiment of the present invention, each of the transmission devices, the reset device, the selection device, and the amplifying device are each a MOSFET (metal oxide semiconductor field effect transistor).

In another embodiment of the present invention, each photo diode has a hexagonal shape arranged in a honeycomb structure. In that case, first and second photo diodes are disposed toward upper left and right sides of a third photo diode, fourth and fifth photo diodes are disposed toward lower left and right sides of the third photo diode, and sixth and seventh photo diodes are disposed toward lower left and right sides of the third photo diode.

In a further embodiment of the present invention, the pixel unit further includes a respective microlens mounted on each photo diode. In an example embodiment, the respective microlens has a circular shape. In addition, a respective color filter disposed between the photo diode and the respective microlens.

In this manner, because transistor devices are shared by photo diodes within a pixel unit, the fill factor is advantageously increased. In addition, with the photo diodes being hexagonal shaped and arranged in a honeycomb structure, the fill factor is further advantageously increased.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4A, 4B, 5, 6, 7, 8, 9, 10, 11, and 12 refer to elements having similar structure and/or function.

DETAILED DESCRIPTION OF THE INVENTION

Figure 1:
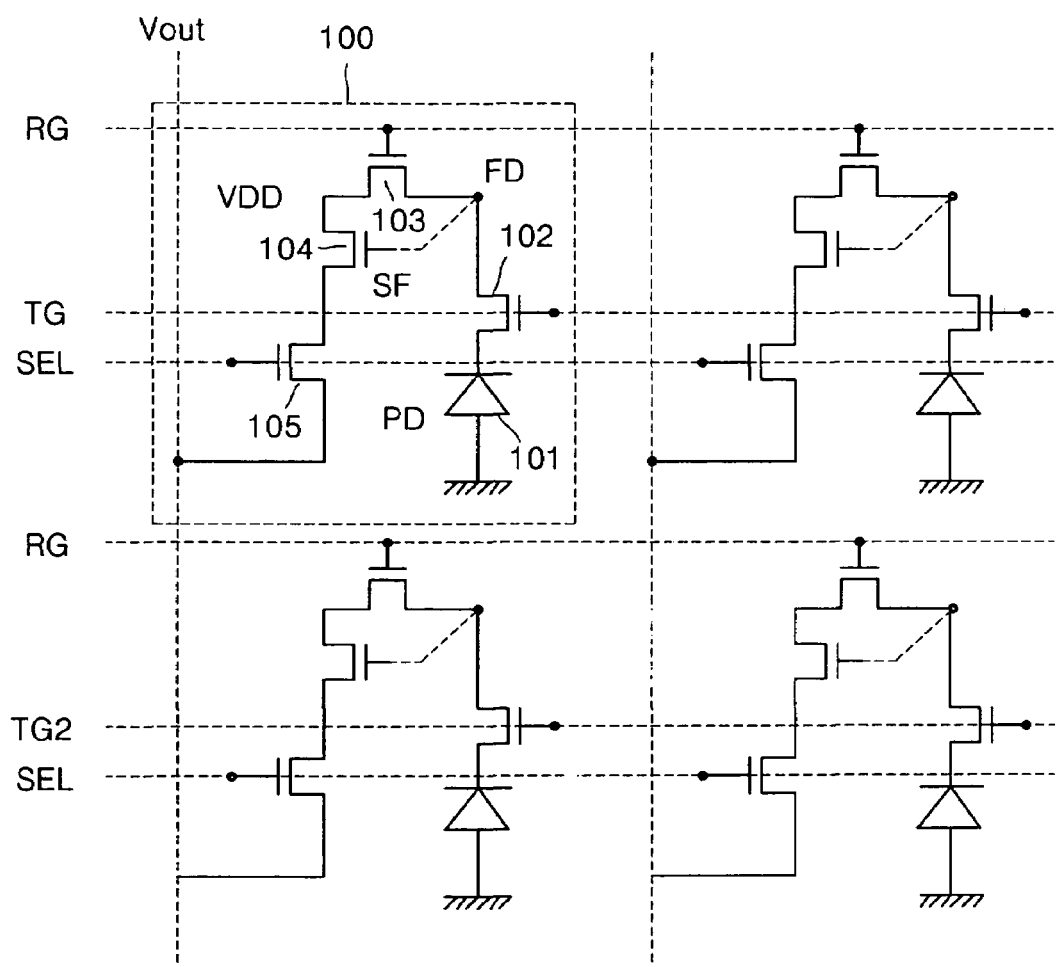
FIG. 1 shows a conventional active pixel sensor.
Figure 2:
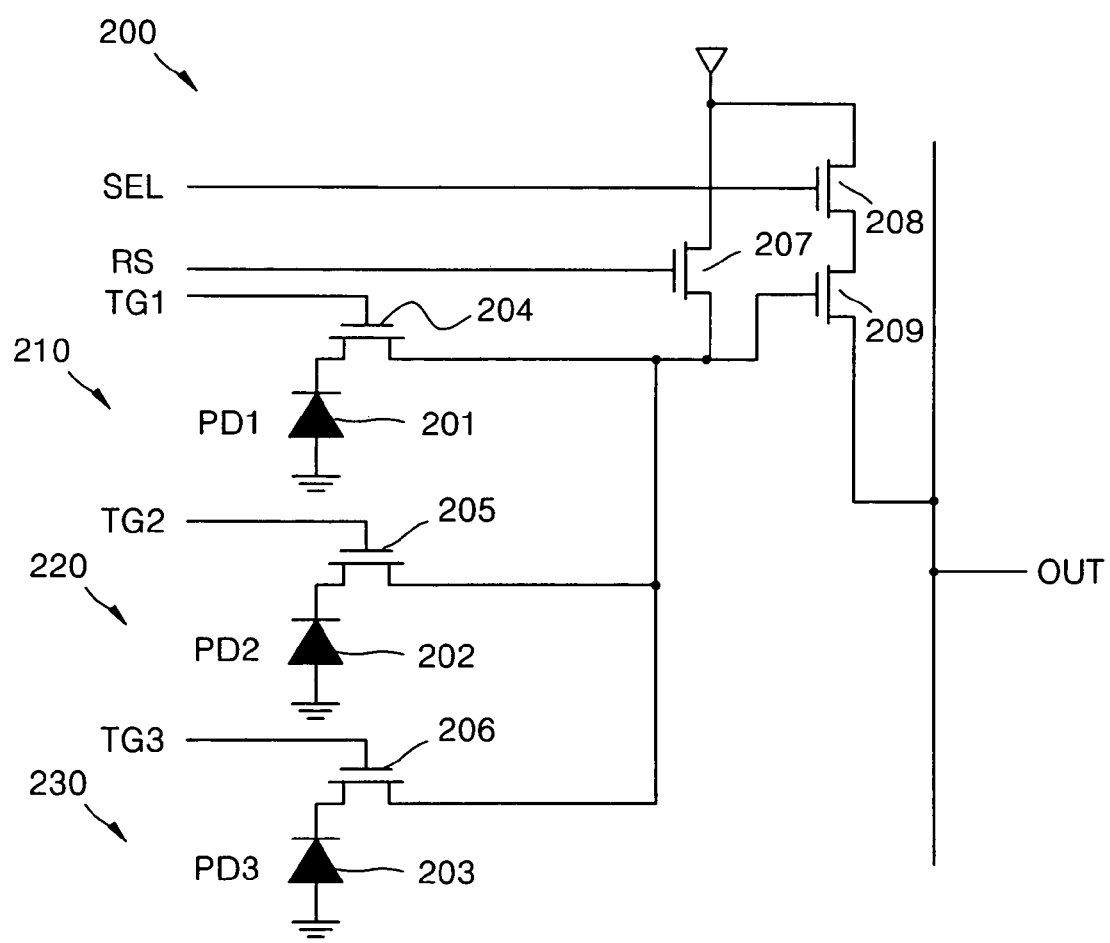
FIG. 2 shows a circuit diagram of a pixel unit of an active pixel sensor, in which three pixels share one floating diffusion (FD) region, according to an embodiment of the present invention.

Referring to FIG. 2, a pixel unit 200 of an active pixel sensor includes three pixels 210, 220, and 230 sharing one floating diffusion (FD) region, according to an embodiment of the present invention. In addition, the pixel unit 200 includes first, second, and third photo diodes 210, 202, and 203 for the first, second, and third pixels 210, 220, and 230, respectively. Furthermore, the pixel unit 200 includes first, second, and third transmission transistors 204, 205, and 206 for the first, second, and third pixels 210, 220, and 230, respectively. The pixel unit 200 also includes a reset transistor 207, a selection transistor 208, and an amplifying transistor 209. All transistors in the pixel unit 200 are each a MOSFET (metal oxide semiconductor field effect transistor) in one embodiment of the present invention.

Figure 3:
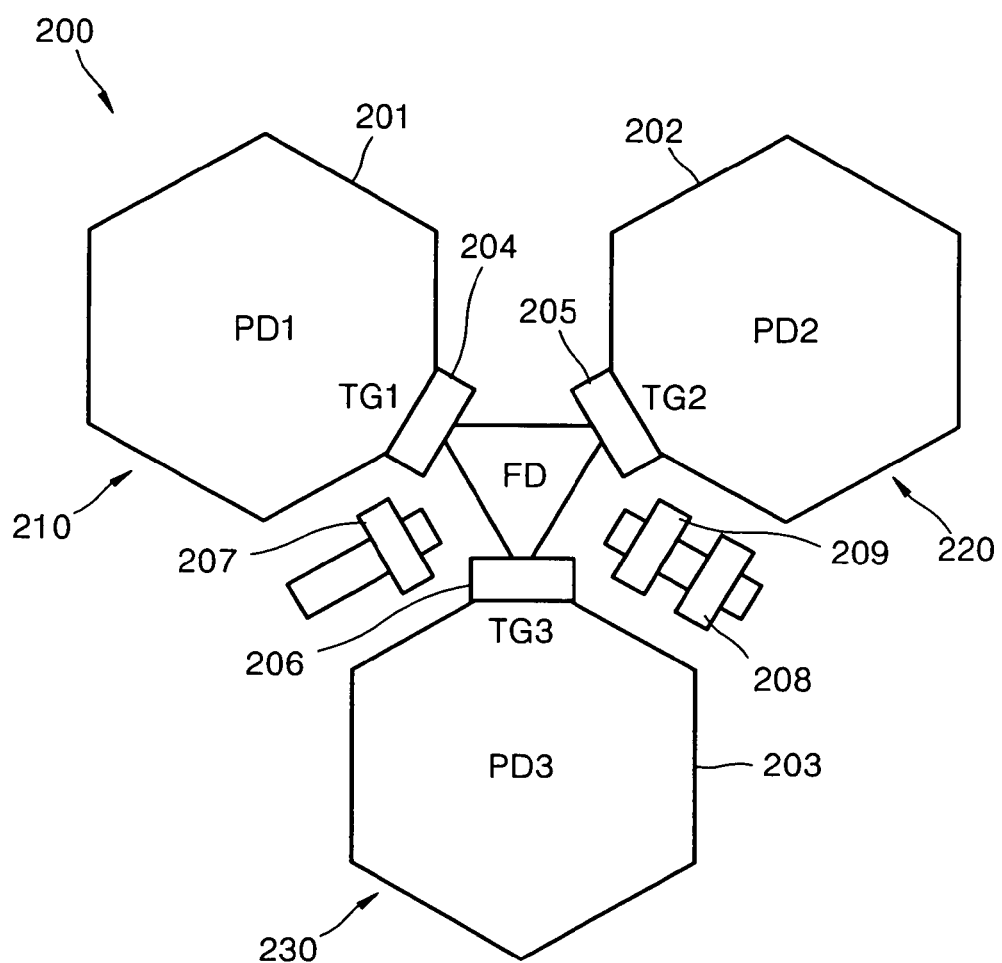
FIG. 3 shows a lay-out of the elements of the pixel unit of FIG. 2, according to an embodiment of the present invention.

FIG. 3 shows a lay-out of the pixel unit 200 of FIG. 2. Referring to FIG. 3, each of the photo diodes 201, 202, and 203 has a hexagonal shape with six sides. A floating diffusion region FD is shared by the photo diodes 201, 202, and 203. The reset transistor 207, the selection transistor 208, and the amplifying transistor 209 are also shared by the three pixels 210, 220, and 230. The respective Image signal for each of the three pixels 210, 220, and 230 is separated by the three transmission transistors 204, 205, and 206.

Figure 4A:
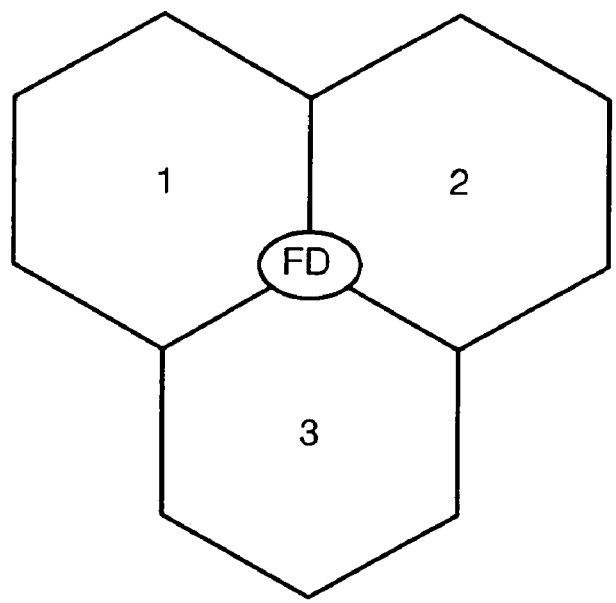
FIGS. 4A and 4B show different lay-outs of the pixel unit of FIG. 2, according to an embodiment of the present invention.
Figure 4B:
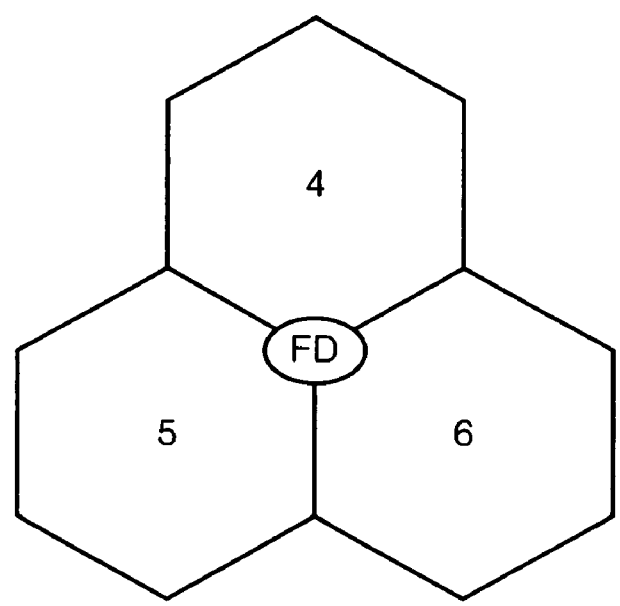

FIGS. 4A and 4B show different lay-outs for the pixel unit 200 of FIG. 2. In a first type of pixel unit array in FIG. 4A, a first pixel 1 and a second pixel 2 are disposed on the upper left and right sides, respectively, of the shared floating diffusion region FD, and a third pixel 3 is disposed below the shared floating diffusion region FD. In a second type of pixel unit array in FIG. 4B, a fourth pixel 4 is disposed above the shared floating diffusion region FD, and a fifth pixel 5 and a sixth pixel 6 are disposed on the lower left and right sides, respectively, of the shared floating diffusion region FD.

Figure 5:
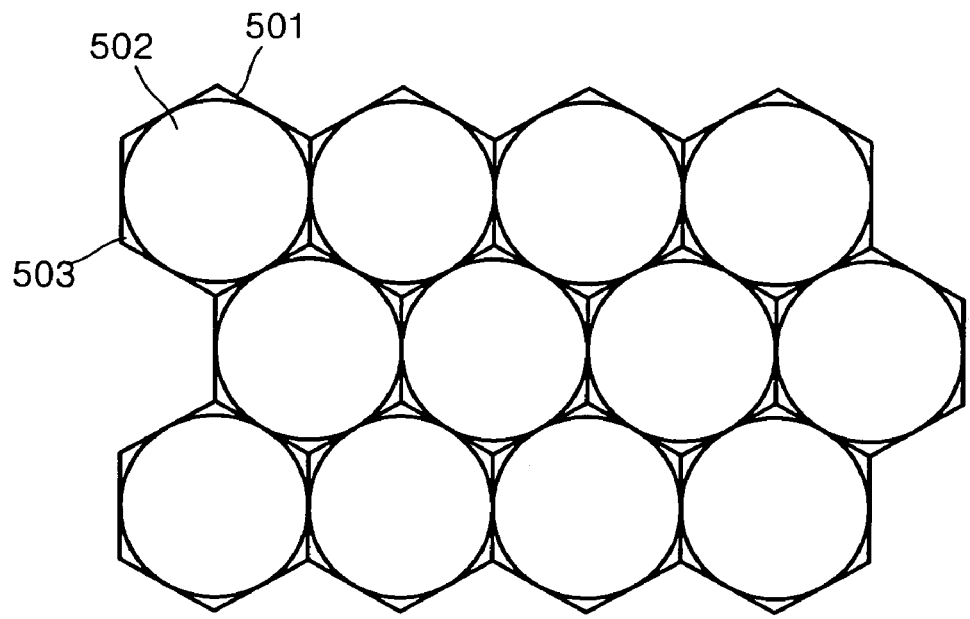
FIG. 5 shows a respective microlens mounted on each hexagonal photo diode, according to an embodiment of the present invention.

FIG. 5 shows a respective microlens 502 mounted on each hexagonal photo diode 501, according to an embodiment of the present invention. Referring to FIG. 5, the microlens 502 almost fully occupies an area of the hexagonal photo diode 501 with a very small dead space 503 when the microlens 502 has a circular shape in one embodiment of the present invention.

Figure 6:
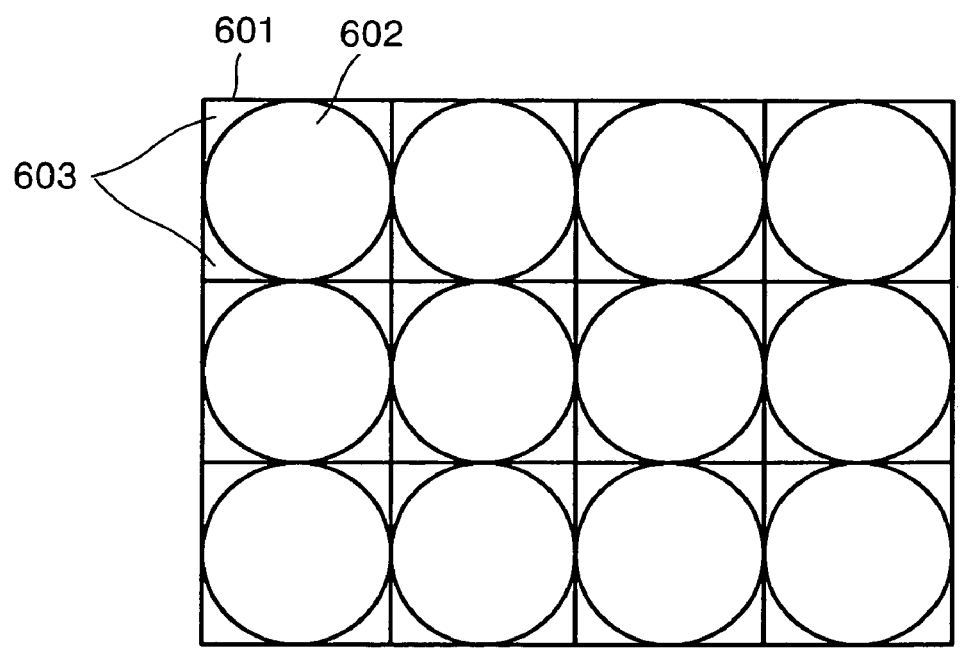
FIG. 6 shows a respective microlens mounted on each conventional rectangular photo diode.

For comparison in FIG. 6, when a circular microlens 602 is mounted on a rectangular photo diode 601, a dead space 603 in FIG. 6 is bigger than the dead space 503 of FIG. 5. When the hexagonal photo diode 501 and the rectangular photo diode 601 have the same area, the dead space 503 in the hexagonal photo diode 501 is 13.5% and the dead space 603 in the rectangular photo diode 601 is 21.5%. In other words, the dead space 503 in the hexagonal photo diode 501 is 8% less than the dead space 603 in the rectangular photo diode 601.

Light from an object is collected by an imaging lens system and then converged by a microlens onto a photo diode. In this situation, a fill factor is greater in a hexagonal photo diode than in a rectangular photo diode.

Figure 7:
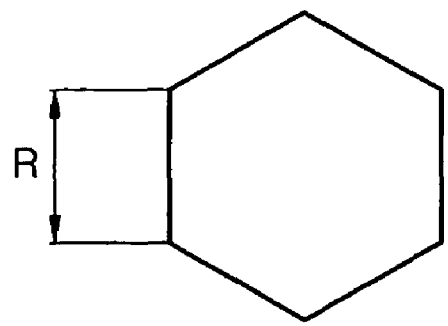
FIG. 7 illustrates a pixel pitch in a pixel unit array according to an embodiment of the present invention.
Figure 7:
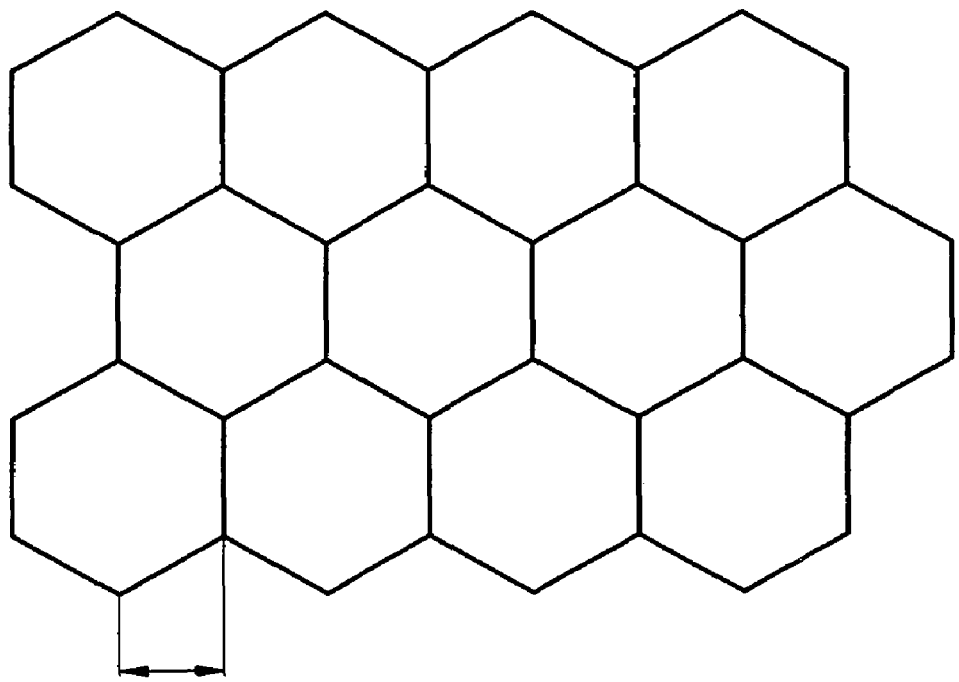

FIG. 7 illustrates a pixel pitch in a pixel unit array according to an embodiment of the present invention. Referring to FIG. 7, when a length of one side of a regular hexagon photo diode is represented with R, an area of the regular hexagon photo diode is expressed as $$\sqrt{3} \times \frac{3}{2} \times R^2.$$

A pitch of a pixel having the regular hexagon photo diode is expressed as $$\frac{\sqrt{3}}{2} \times R.$$

Figure 8:
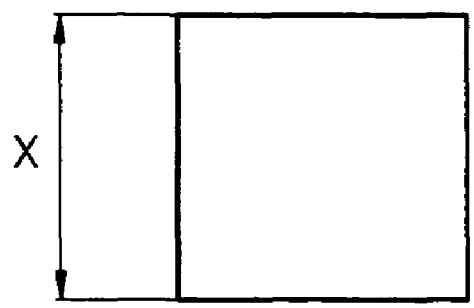
FIG. 8 illustrates a pixel pitch in a conventional pixel array having a rectangular photo diode.
Figure 8:
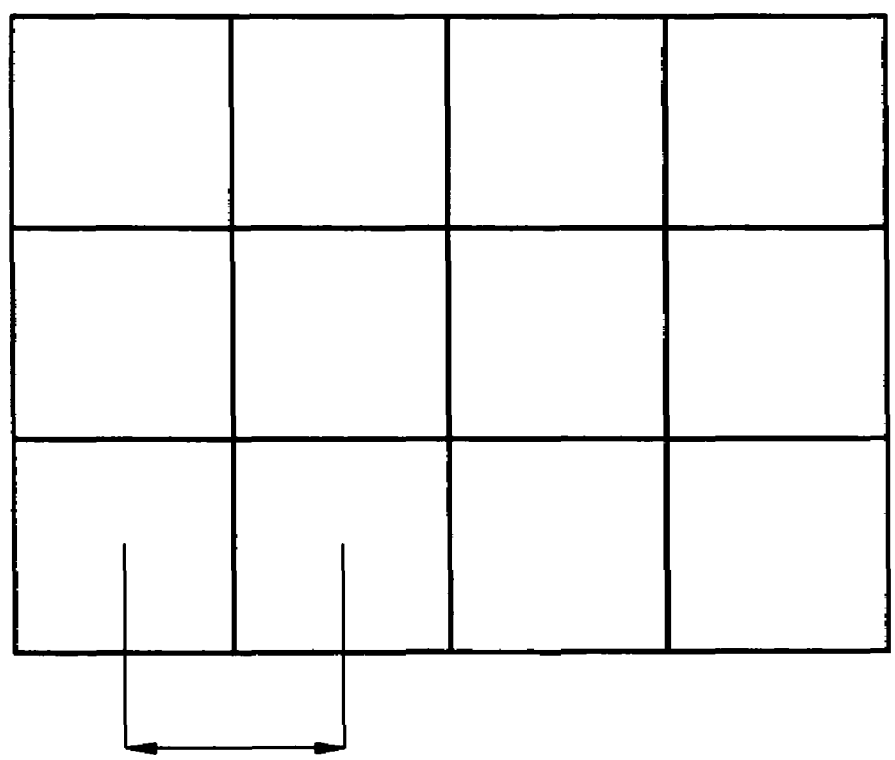

Meanwhile, referring to FIG. 8, when a length of one side of a square photo diode is represented with X, a pixel pitch is expressed as X, and the area of the square photo diode is expressed as $X^2$.

Table 1 shows a comparison of pixel pitches between a regular hexagon photo diode and a square photo diode having the same area.

TABLE 1

| Area of photo diode | Square photo diode | Regular hexagon photo diode | Length of one side of regular hexagon |
| --- | --- | --- | --- |
| 31.4 | 5.6 | 3.0 | 3.5 |
| 16 | 4 | 2.1 | 2.5 |
| 14.4 | 3.8 | 2.0 | 2.4 |
| 7.8 | 2.8 | 1.5 | 1.7 |

Referring to Table 1, for the same area of a photo diode, a pixel pitch of a regular hexagon photo diode is less than that of a square photo diode. This means that an image signal and particularly a stripe-patterned image signal may be more clearly displayed with hexagon shaped photo diodes than with square shaped photo diodes.

Figure 9:
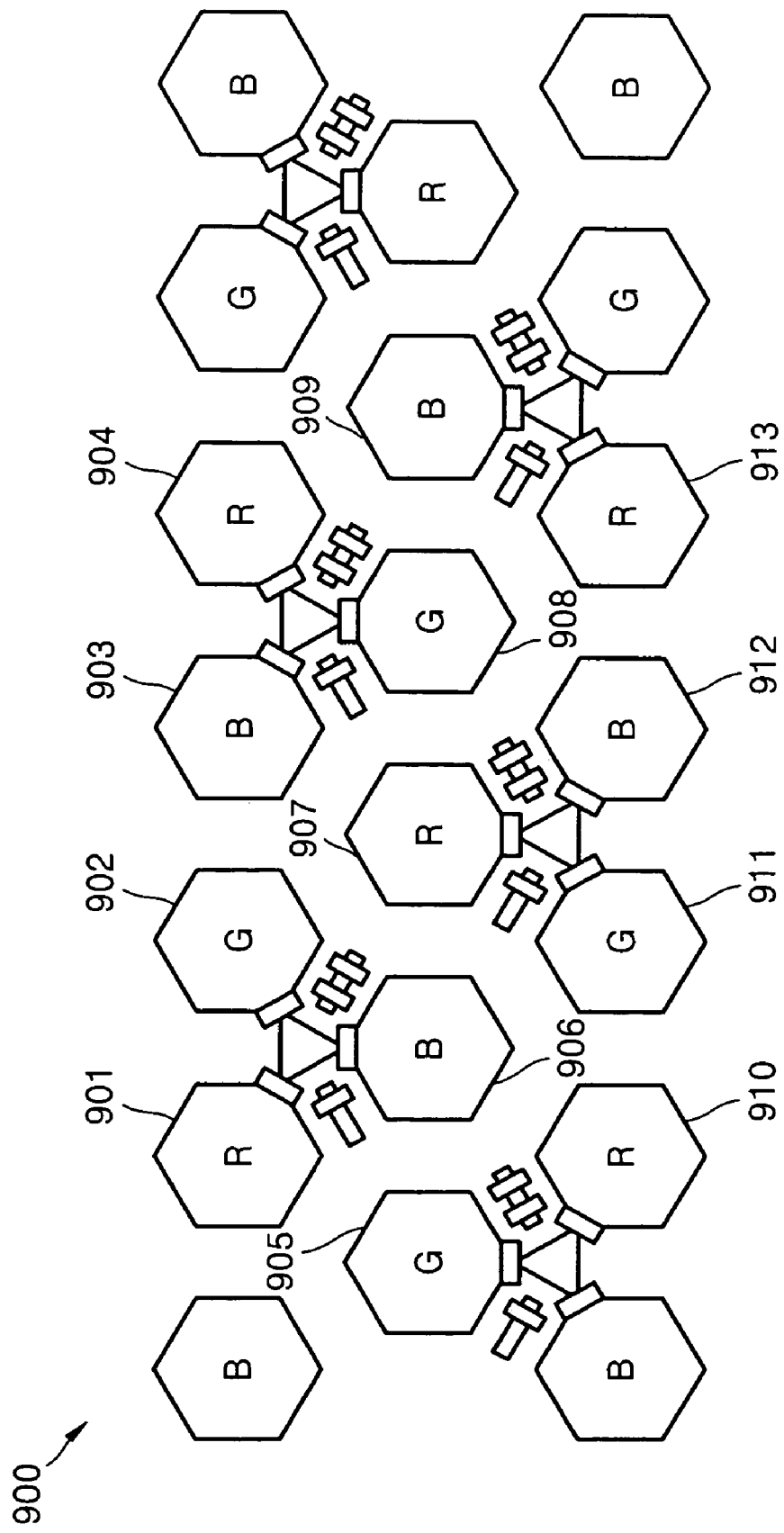
FIG. 9 shows a color filter array according to an embodiment of the present invention.

FIG. 9 shows a color filter array 900 according to an embodiment of the present invention. A respective color filter for filtering through a respective color is disposed above each hexagon shaped photo diode. Such a respective color filter is disposed between the hexagon shaped photo diode and the respective microlens for the hexagon shaped photo diode.

In the color filter array 900, for a blue filter 906 on a second row, a red filter 901 and a green filter 902 are disposed on a first row toward the upper left and right sides of the photo diode for the blue filter 906. A green filter 905 and a red filter 907 are disposed on the left and right sides of the photo diode for the blue filter 906 on the second row. A red filter 910 and a green filter 911 are on a third row toward the lower left and right sides of the photo diode for the blue filter 906. Thus, the three red filters 901, 907, and 910 and the three green filters 902, 905, and 911 are alternately disposed around the photo diode for the blue filter 906.

For the red filter 907 on the second row, the green filter 902 and a blue filter 903 are disposed on the first row toward the upper left and right sides of the photo diode for the red filter 907. The blue filter 906 and a green filter 908 are disposed on the left and right sides of the red filter 907 on the second row. The green filter 911 and a blue filter 912 are disposed on the third row toward the lower left and right sides of the photo diode for red filter 907. Thus, the three green filters 902, 908, and 911 and the three blue filters 903, 906, and 912 are alternately disposed around the photo diode for the red filter 907.

For the green filter 908 on the second row, the blue filter 903 and a red filter 904 are disposed on the first row toward the upper left and right sides of the photo diode for the green filter 908. The red filter 907 and a blue filter 909 are disposed on the second row on the left and right sides of the green filter 908. The blue filter 912 and a red filter 913 are disposed on the third row toward the lower left and right sides of the photo diode for the green filter 908. Thus, the three blue filters 903, 909, and 912 and the three red filters 904, 907, and 913 are alternately disposed around the photo diode for the green filter 908.

Figure 10:
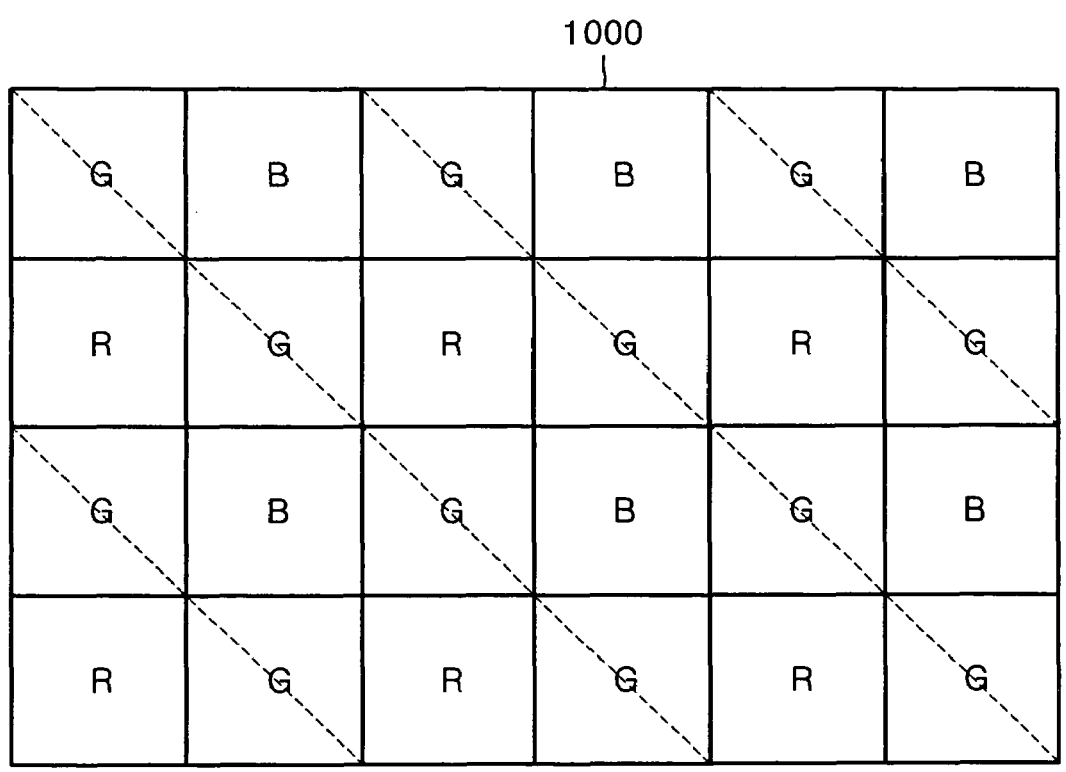
FIG. 10 shows a conventional Bayer color array.

In addition, in the color filter array 900, blue filters B, red filters R, and green filters G are uniformly arranged on each row. For comparison, a conventional Bayer color array 1000 is illustrated in FIG. 10. Referring to FIG. 10, in the conventional Bayer color array 1000, green filters G are arranged on a slant line, and a red filter R or a blue filter B is inserted between green filters G on a horizontal or vertical line. In the Bayer color array 1000, only green and blue filters G and B are disposed on odd rows, and only red and green filters R and G are disposed on even rows. In other words, the blue, red and green filters B, R, and G are not uniformly disposed on each row in the conventional Bayer color array 1000, which may result in noise in an image pattern signal.

Figure 11:
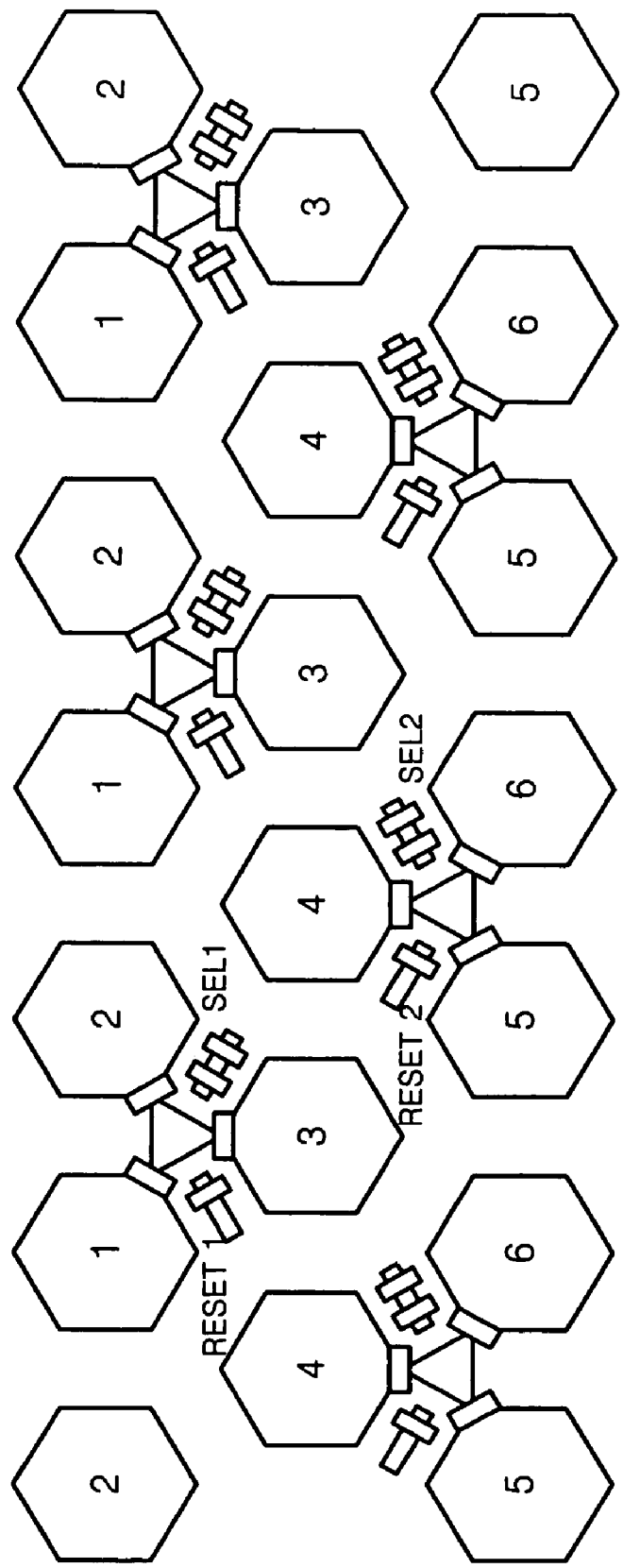
FIG. 11 shows a pixel array including the pixel units of FIGS. 4A and 4B, according to an embodiment of the present invention.
Figure 12:
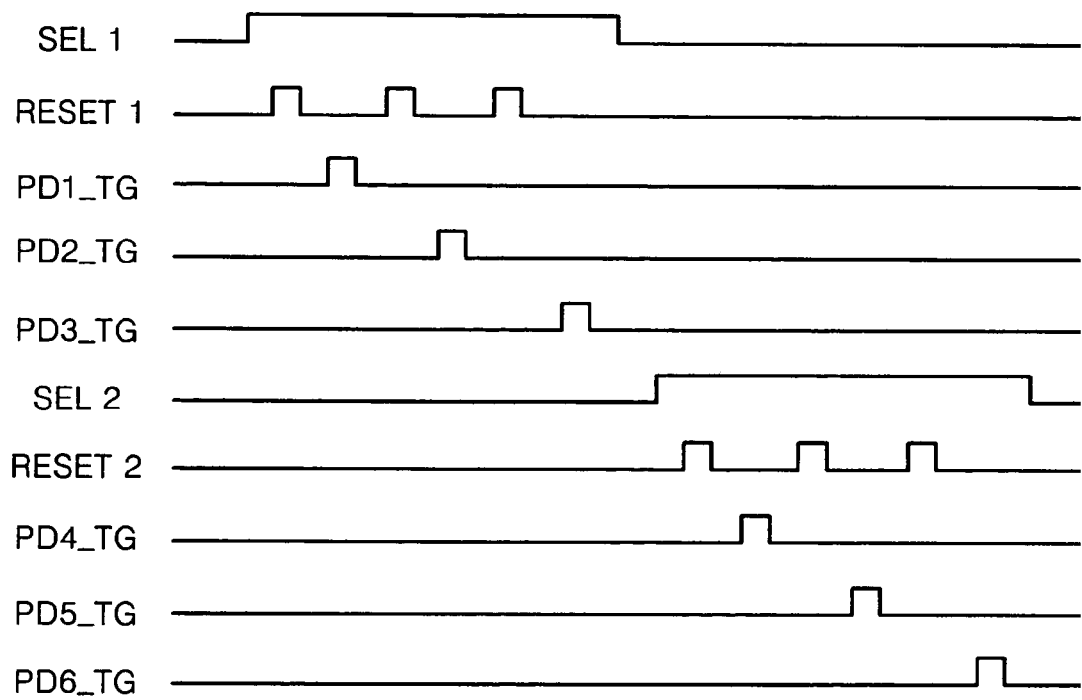
FIG. 12 shows a timing diagram for a reading operation of the pixel array of FIG. 11, according to an embodiment of the present invention.

FIG. 11 shows a pixel array including the pixel units of FIGS. 4A and 4B. FIG. 12 is a timing diagram for a reading operation in the pixel array of FIG. 11. In the pixel array of FIG. 11, image signals are read from the pixels in the order of 1-2-3-4-5-6. Referring to FIGS. 11 and 12, while a first selection signal SEL1 is activated and after a first reset signal RESET1 is activated, a first transmission signal PD1_TG, a second transmission signal PD2_TG, and a third transmission signal PD3_TG are sequentially activated.

In detail, after the pixels 1, 2, and 3 are reset in response to a first activated pulse of the first reset signal RESET1, optical charges stored in a hexagonal photo diode of the first pixel 1 is read as a signal in response to an activated pulse of the first transmission signal PD1_TG. After the pixels 1, 2, and 3 are reset in response to a second activated pulse of the first reset signal RESET1, optical charges stored in a hexagonal photo diode of the second pixel 2 is read as a signal in response to an activated pulse of the second transmission signal PD2_TG. After the pixels 1, 2, and 3 are reset in response to a third activated pulse of the first reset signal RESET1, optical charges stored in a hexagonal photo diode of the third pixel 3 is read as a signal in response to an activated pulse of the third transmission signal PD3_TG.

Thereafter, while a second selection signal SEL2 is activated and after a second reset signal RESET2 is activated, a fourth transmission signal PD4_TG, a fifth transmission signal PD5_TG, and a sixth transmission signal PD6_TG are sequentially activated. In detail, after the pixels 4, 5, and 6 are reset in response to a first activated pulse of the second reset signal RESET2, optical charges stored in a hexagonal photo diode of the fourth pixel 4 is read as a signal in response to an activated pulse of the fourth transmission signal PD4_TG.

After the pixels 4, 5, and 6 are reset in response to a second activated pulse of the second reset signal RESET2, optical charges stored in a hexagonal photo diode of the fifth pixel 5 is read as a signal in response to an activated pulse of the fifth transmission signal PD5_TG. After the pixels 4, 5, and 6 are reset in response to a third activated pulse of the second reset signal RESET2, optical charges stored in a hexagonal photo diode of the sixth pixel 6 is read as a signal in response to an activated pulse of the sixth transmission signal PD6_TG.

In this manner, because transistor devices are shared by photo diodes within a pixel unit, the fill factor is advantageously increased. In addition, with the photo diodes being hexagonal shaped and arranged in a honeycomb structure, the fill factor is further advantageously increased.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, any number of elements shown and described herein is by way of example only. In addition, any particular device elements and shapes of elements as shown and described herein are by way of example only.

What is claimed is:

1. A pixel unit comprising:
   a plurality of photo diodes, each photo diode fabricated with at least five sides;
   a floating diffusion region disposed between the photo diodes; and
   a plurality of transmission devices, each transmission device disposed and coupled between a respective photo diode and the floating diffusion region;
   wherein each photo diode has a hexagonal shape;
   and wherein the photo diodes are arranged in a honeycomb structure.

2. The pixel unit of claim 1, wherein first and second photo diodes are disposed toward upper left and right sides of a third photo diode.

3. The pixel unit of claim 1, wherein first and second photo diodes are disposed toward lower left and right sides of a third photo diode.

4. The pixel unit of claim 1, further comprising:
   a respective microlens mounted on each photo diode.

5. The pixel unit of claim 4, wherein the respective microlens has a circular shape.

6. The pixel unit of claim 4, further comprising:
   a respective color filter disposed between the photo diode and the respective microlens.

7. An image sensor comprising:
   a first photo diode fabricated with at least five sides;
   second and third photo diodes disposed to sides of the first photo diode; and
   a respective color filter disposed over each of the first, second, and third photo diodes;
   wherein the color filters of the first, second, and third photo diodes are for different colors, and wherein each of the photo diodes has a hexagonal shape, and wherein the second and third photo diodes are disposed to upper left and right sides of the first photo diode, and wherein the image sensor further includes:
      fourth and fifth photo diodes disposed to left and right sides of the first photo diode; and
      sixth and seventh photo diodes disposed to lower left and right sides of the first photo diode; and
   a respective color filter disposed over each of the fourth, fifth, sixth, and seventh photo diodes, wherein the color filters for the second, third, fourth, fifth, sixth, and seventh photo diodes are for different colors from the color filter of the first photo diode.

8. The image sensor of claim 7, wherein the color filters for the second, third, fourth, fifth, sixth, and seventh photo diodes are for two colors that alternate around the first photo diode.

9. The image sensor of claim 7, wherein the colors filters for the first, second, third, fourth, fifth, sixth, and seventh photo diodes are for red, blue, and green colors.

10. The image sensor of claim 7, further comprising:
    a floating diffusion region shared by and disposed between the first, second, and third photo diodes.

11. The image sensor of claim 10, further comprising:
    a respective transmission device disposed between the floating diffusion region and each photo diode;
    a reset device coupled to the floating diffusion region; and
    a selection device and an amplifying device coupled in series to the floating diffusion region.

12. A method of sensing an image, comprising:
    converting a respective photo signal of a respective color to a respective electrical signal at each of first, second, and third photo diodes, each fabricated with at least five sides; and serially transferring the respective electrical signals from the photo diodes to a shared floating diffusion region disposed between the photo diodes;

wherein each photo diode has a hexagonal shape arranged within a honeycomb structure.

13. The method of claim 12, wherein first and second photo diodes are disposed toward upper left and right sides of a third photo diode.

14. The method of claim 12, wherein first and second photo diodes are disposed toward lower left and right sides of a third photo diode.

15. The method of claim 12, wherein a respective microlens is mounted on each photo diode.

16. The method of claim 15, wherein the respective microlens has a circular shape.

17. The method of claim 15, wherein a respective color filter is disposed between the photo diode and the respective microlens.

18. The pixel unit of claim 1, further comprising:

a reset device coupled to the floating diffusion region; and a selection device and an amplifying device coupled in series to the floating diffusion region.

19. The pixel unit of claim 18, wherein each of the transmission devices, the reset device, the selection device, and the amplifying device are each a MOSFET (metal oxide semiconductor field effect transistor).

* * * * *